(12) United States Patent
Capasso et al.

(10) Patent No.: US 7,010,010 B2
(45) Date of Patent: Mar. 7, 2006

(54) BROADBAND CASCADE LIGHT EMITTERS

(75) Inventors: Federico Capasso, Westfield, NJ (US); Alfred Yi Cho, Summit, NJ (US); Claire F. Gmachl, New Providence, NJ (US); Milton L. Peabody, Somerville, NJ (US); Arthur Mike Sergent, New Providence, NJ (US); Deborah Lee Sivco, Warren, NJ (US); Alexander Soibel, Westfield, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 311 days.

(21) Appl. No.: 10/465,253

(22) Filed: Jun. 19, 2003

(65) Prior Publication Data
US 2006/0007973 A1    Jan. 12, 2006

(51) Int. Cl.
*H01S 5/00* (2006.01)
(52) U.S. Cl. .................... 372/45.01; 372/46.01
(58) Field of Classification Search ............. 372/44.01, 372/45.01, 45.012, 46.01
See application file for complete search history.

(56) References Cited

U.S. PATENT DOCUMENTS

| | | | |
|---|---|---|---|
| 5,978,397 A | 11/1999 | Capasso et al. ................ 372/45 |
| 6,055,254 A * | 4/2000 | Capasso et al. ........... 372/45.01 |
| 6,144,681 A | 11/2000 | Capasso et al. ................ 372/45 |
| 6,148,012 A | 11/2000 | Capasso et al. ................ 372/45 |
| 6,278,134 B1 * | 8/2001 | Capasso et al. ................ 257/96 |
| 6,324,199 B1 | 11/2001 | Capasso et al. ................ 372/45 |
| 6,370,164 B1 * | 4/2002 | Islam ............................ 372/6 |
| 6,404,791 B1 * | 6/2002 | Yang ....................... 372/45.01 |
| 6,463,088 B1 | 10/2002 | Baillargeon et al. ........... 372/46 |
| 6,836,499 B1 * | 12/2004 | Capasso et al. ........... 372/50.22 |
| 2002/0191658 A1 * | 12/2002 | Capasso et al. ................ 372/45 |

OTHER PUBLICATIONS

Sirtori et al., *Optics Lett.*, vol. 23, No. 6, pp. 463-465 (Mar. 1998).
Gmachl et al., *Appl. Phys. Lett.*, vol. 79, No. 5, pp. 572-574 (Jul. 2001).
Gmachl et al., *Nature*, vol. 415, pp. 883-887 (Feb. 2002).
Sirtori et al., *Appl. Phys. Lett.*, vol. 66, No. 24, pp. 3242-3244 (Jun. 1995).

(Continued)

*Primary Examiner*—Minsun Oh Harvey
*Assistant Examiner*—James Menefee

(57) ABSTRACT

A broadband CLE capable of operation simultaneously at multiple wavelengths comprises: a core region including a multiplicity or cascade of stages, each stage including a radiative transition region. A first group of stages emits radiation at a first wavelength and at a first aggregate intensity per group, and a second group of stages emits radiation at a second wavelength and at a second aggregate intensity per group lower than the first intensity. The invention is characterized in that the second group has more stages than said first group, and the per-stage intensity of the first group is greater than that of the second group. This design reduces the difference between said first and second aggregate intensities. In one embodiment, groups that are located at or near to the ends of the cascade have more stages than groups that are centrally located within the cascade regardless of their wavelength. Our invention significantly reduces variations in modal gain across the desired broadband spectrum and produces sufficiently flat gain without requiring elaborate redesign of the stages. These features enable cw operation of a broadband intersubband laser.

10 Claims, 7 Drawing Sheets

OTHER PUBLICATIONS

Faist et al., *Appl. Phys. Lett.,* vol. 68, No. 26, pp. 3680-3682 (Jun. 1996).

Hakki et al., *J. Appl. Phys.,* vol. 46, No. 3, pp. 1299-1306 (Mar. 1975).

Luo et al., IEEE J. Quantum Electron., vol. 38, No. 5, pp. 486-494 (May 2002).

Kosterev et al., IEEE J. Quantum Electron., vol. 38, No. 6, pp. 582-591 (Jun. 2002).

Paiella et al., *Science,* vol. 290, pp. 1739-1742 (Dec. 2000).

Straub et al., *Electr. Lett.,* vol. 38, No. 12, pp. 565-567 (Jun. 2002).

Owschimikow et al., *Phys. Rev. Lett.,* vol. 90, No. 4, pp. 1-4 (Jan. 2003).

Capasso et al., Copending U.S. Appl. No. 09/883,542 filed on Jun. 18, 2001 (no copy attached).

* cited by examiner

ND CASCADE LIGHT EMITTERS

GOVERNMENT CONTRACT

This invention was made with Government support under Contract No. DAAD19-00-C-0096 by the DARPA/US Army Research Office. The Government has certain rights in this invention.

BACKGROUND OF THE INVENTION

1. Field of the Invention

This invention relates to semiconductor cascade light emitters (CLEs) in general and, more particularly, to broadband intersubband (ISB) [e.g., quantum cascade (QC)] lasers adapted for continuous wave (cw) operation.

2. Discussion of the Related Art

A broadband emitter has two principal characteristics: first, it simultaneously emits optical radiation (light) at multiple wavelengths, and second, adjacent emission wavelengths are sufficiently close to one another that their intensity does not fall to zero in the spectral region between them. The latter characteristic also means that the tails of the intensity profiles of adjacent wavelengths overlap one another. Broadband CLE devices include ISB cascade emitters, which usually operate in the mid-IR portion of the spectrum, and interband cascade emitters, which usually operate in the shorter IR range of about 1–5 $\mu$m.

ISB lasers are expected to be scientifically and technologically important for applications, such as chemical and biological sensing. In addition, due to its broad spectrum a broadband ISB laser has the potential to generate ultrashort pulses (e.g., below 1 ps) by mode-locking. Self-mode-locking of QC lasers based on the optical Kerr effect has been observed.

Dual wavelength QC lasers, for example, are described in U.S. Pat. No. 5,978,397 issued on Nov. 2, 1999 (Capasso et al. 43-74-7-11-8-12). This patent discloses, inter alia, a QC laser that utilizes a single type of radiative transition (RT) region (i.e., all RT regions are designed to emit at the same wavelength) but is field-tunable by means of a segmented electrode configuration. In one embodiment this QC laser was tunable over a range of about 6.2–6.6 $\mu$m, but required relatively complex circuitry.

Another illustration of a dual wavelength QC laser that utilizes a single type of RT region is described in U.S. Pat. No. 6,144,681 issued on Nov. 7, 2000 (Capasso et al. 48-80-12-15-12-17-1). This emitter is a 3-level device that emits light at two wavelengths by either of two mechanisms: (1) by a pair of vertical electron transitions at different wavelengths in a single quantum well, or (2) by a diagonal electron transition at one wavelength from one well into an adjacent well followed by a vertical electron transition at a different wavelength from the latter well. This source, also described by C. Sirtori et al. in *Optics Lett.*, Vol. 23, No. 6, pp. 463–465 (1998), exhibited well-resolved luminescence peaks at wavelengths of 8 $\mu$m and 10 $\mu$m. However, the transitions were inefficient, and it was difficult to optimize both at the same time. Consequently, laser action was achieved on only one transition from the upper level to the middle level.

Yet another example of multi-wavelength ISB light emitters that utilize a single type of RT region is described in U.S. Pat. No. 6,148,012 issued on Nov. 14, 2000 (Capasso et al. 53-85-6-18-22-4). Here, the energy separation of the center wavelengths is greater than the largest line broadening energy associated with the emission wavelengths and means are provided for inhibiting the relaxation of electrons (e.g., the emission of optical phonons) from the upper to the lower energy levels associated with the radiative transitions. Illustrative emission spectra exhibited simultaneous lasing lines at about 6.3 $\mu$m, 7.3 $\mu$m and 7.9 $\mu$m.

In contrast, two wavelength operation has also been achieved in a QC laser having a heterogeneous cascade; i.e., a cascade that includes at least two different types of RT regions, each designed to emit radiation at a different wavelength. These devices are described in copending U.S. patent application Ser. No. 09/883,542 (Capasso et al 68-107-2-21-3-37) and by C. Gmachl et al. in *Appl. Phys. Lett.*, Vol. 79, No. 5, pp. 572–574 (July 2001). In one embodiment, the heterogeneous cascade included two substacks that were optimized to emit at isolated wavelengths of 5.2 $\mu$m and 8.0 $\mu$m. Each substack was apportioned the optimum fraction of the applied bias voltage. This laser was not a broadband source; the intensity profiles of the 5.2 $\mu$m and 8.0 $\mu$m lines fell to zero in the spectral region between them.

Finally, a broadband QC laser emitting at wavelengths from 6 $\mu$m to 8 $\mu$m in a pulsed mode has recently been demonstrated by C. Gmachl et al., as reported in *Nature*, Vol. 415, pp. 883–887 (February 2002). A number of dissimilar ISB optical transitions were made to cooperate in order to provide broadband optical gain from 5 $\mu$m to 8 $\mu$m. This laser had 36 stages with radiative transition (RT) regions each centered at a different emission wavelength. The stages of RT regions and I/R (injection/relaxation) regions were designed to compensate for the wavelength dependent losses and achieve flat net gain over the desired wavelength region of operation. However, discrepancies between calculations and experiments were significant and caused considerable variation of the net modal gain across the spectrum that prevented broadband cw operation of these lasers.

The publications discussed above, as well as the patents and applications (all of which are assigned to the assignee hereof), are incorporated herein by reference.

Thus, a need remains in the art for a broadband ISB laser that is capable of cw operation.

A need also remains for broadband CLEs in which the difference in intensity between different wavelengths is reduced (i.e., the intensity or gain profile is flattened).

BRIEF SUMMARY OF THE INVENTION

In accordance with one aspect of our invention, a broadband CLE capable of operation simultaneously at multiple wavelengths comprises: a core region including a multiplicity or cascade of stages, each stage including a radiative transition region. A first group of stages emits radiation at a first wavelength and at a first aggregate intensity per group, and a second group of stages emits radiation at a second wavelength and at a second aggregate intensity per group lower than the first intensity. The invention is characterized in that the second group has more stages than said first group, and the per-stage intensity of the first group is greater than that of the second group. This design reduces the difference between said first and second aggregate intensities. In one embodiment, groups that are located at or near to the ends of the cascade have more stages than groups that are centrally located within the cascade regardless of their wavelength.

Our invention significantly reduces variations in modal gain across the desired broadband spectrum and produces sufficiently flat gain without requiring elaborate redesign of the stages. These features have enabled us to achieve cw operation of a broadband ISB laser.

In accordance with another aspect of our invention, a method of fabricating a broadband CLE capable of operation simultaneously at multiple wavelengths, comprises the steps of: (a) designing the CLE to include a core region that has a cascade of stages, each stage including a radiative transition region, and designing the cascade to include a multiplicity of groups of stages for emitting radiation, each group at a different wavelength, and most of said groups being initially designed to have essentially the same number of stages; (b) measuring the optical intensities generated by said groups and identifying those groups that have lower aggregate intensities; (c) redesigning the CLE so as to increase the number of stages in at least one group that was identified as having a lower intensity than at least one other group; and (d) constructing the CLE according to the redesign of step (c). In one embodiment, in step (a), two of the groups are designed to be located at opposite ends of the cascade and initially to have more stages than groups located centrally within the cascade, the centrally located groups initially being designed to have the same number of stages.

BRIEF DESCRIPTION OF THE SEVERAL VIEWS OF THE DRAWING

Our invention, together with its various features and advantages, can be readily understood from the following more detailed description taken in conjunction with the accompanying drawing, in which.

DETAILED DESCRIPTION OF THE INVENTION

General Structure

Figure 1:
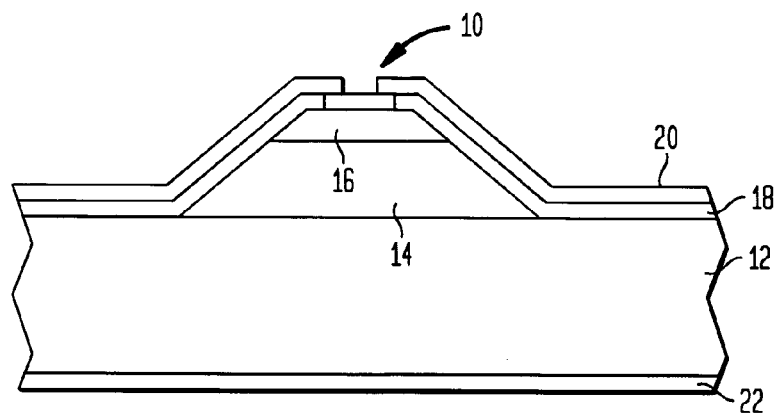
FIG. 1 is a schematic, cross-sectional view of an ISB laser in accordance with an illustrative embodiment of our invention.

With reference now to FIG. 1, a prior art homogeneous ISB semiconductor light emitter (e.g., a QC laser) 10 comprises a core region 14 sandwiched between an upper cladding region 16 and a lower cladding region 12. The core region includes the active region of the laser. The active region, in turn, includes a multiplicity of essentially identical repeat units or stages; that is, the overall device is termed homogeneous. In a typical design, each stage includes a radiative transition (RT) region and an adjacent injection/relaxation (I/R) region. Alternatively, each stage may include an RT region sandwiched between an I-region and a R-region, as described in U.S. Pat. No. 6,324,199 issued on Nov. 27, 2001 (Capasso et al. 56-91-9-9-21-25-6), which is assigned to the assignee hereof and incorporated herein by reference. When the light emitter is designed to operate at a single center wavelength, all of its stages are essentially identical to one another. However, when the light emitter is designed to operate simultaneously at multiple center wavelengths, the stages are designed in accordance with our invention, as described in the next section.

The term ISB in general refers to the well-known unipolar nature of the optical and electronic transitions that take place in the RT and I/R regions.

Typically the substrate on which the various layers of the emitter are formed serves as the lower cladding region. Alternatively, a lower cladding region, separate from the substrate, may be formed between the substrate and the core region. The upper cladding region 16 and the core region 14 are illustratively formed in the shape of a mesa or trapezoid typical of ridge waveguide laser structures. The mesa may be deep-etched as shown to stop at or near the bottom of the core region 14, or it may be shallow-etched (not shown) so that the mesa extends only through the upper cladding region. The deep-etched design provides better current confinement and is preferred for cw operation.

In either case, an electrically insulating layer 18 (e.g., $Si_3N_4$ or $SiO_2$) is formed over the top of the device and is patterned to form an opening that exposes a portion of the top of the mesa. Alternatively, the insulating layer may comprise a chalcogenide glass of the type described in U.S. Pat. No. 6,463,088 issued on Oct. 8, 2002 (Baillargeon et al. 12-62-100-15-26-5-2-5-31-11), which is assigned to the assignee hereof and is incorporated herein by reference. A first electrode 20 is formed over the insulating layer 18 and in the opening so as to contact the upper cladding region (usually by means of a highly doped contact-facilitating layer, not shown), and a second electrode 22 is formed on the substrate 12.

The substrate itself may be a single crystal semiconductor body or a combination of such a body with another layer (e.g., an epitaxial layer grown on the top surface of the body). Illustratively, lasers of this type are fabricated from Group III-V compound semiconductors; e.g., In-based Group III-V compounds such as GaInAs and AlInAs for operation at mid-infrared wavelengths of about 4–24 $\mu$m. At shorter wavelengths, Group III-V compounds such as GaN and AlGaN may be used. Within any particular materials system the specific wavelength of operation is determined primarily by the thickness of the quantum wells that make up the RT regions.

A similar structure may be used for other types of CLEs; e.g., cascaded interband light emitters in which each stage also includes an RT region (although not unipolar) and an I/R region. These devices are also typically fabricated from Group III-V compound semiconductors, but usually operate in a mostly shorter wavelength range of about 1–5 μm.

Drive circuitry, not shown, is coupled across the electrodes in order to provide an external voltage bias and to supply pumping energy (e.g., electric current) to the laser of sufficient magnitude to generate light. Below threshold the emitter operates as an incoherent, spontaneous emission source, whereas above threshold it operates as a coherent, stimulated emission source. In the latter case, when provided with optical feedback, the source functions as a laser. Suitable optical feedback is typically provided by an optical cavity resonator formed, for example, by cleaved crystal facets, distributed feedback (DFB) gratings, distributed Bragg reflectors (DBRs), or a combination of them. In FIG. 1 one cleaved facet of the resonator might be the end face depicted, whereas the other, parallel facet would be at the opposite end (not shown) of the laser.

CW Broadband Design

In accordance with one aspect of our invention, a sufficiently flat gain profile is achieved across the spectrum of a broadband ISB laser to enable the laser to operate cw simultaneously at multiple center wavelengths. In accordance with one embodiment of our invention, the core region 14 includes a multiplicity (or cascade) of stages (or repeat units) with different stages or groups of stages being designed to emit radiation (light) at different center (peak) wavelengths. In prior art ISB lasers some stages emit radiation at a higher intensity than other stages. Consequently, it is difficult for the laser to operate cw at all of its design wavelengths, particularly those that emit at lower intensity. This inherent lack of uniformity in the optical intensity across the cascade exists because the optical gain (and loss) varies with wavelength, and the particular structure of the RT region, and because the RT regions of stages that are located at or near the ends of a cascade experience less optical overlap with the RT regions of adjacent stages than do the RT regions of stages centrally located within the cascade. Our simple but elegant solution is to increase the number of stages of any or all stages that generate radiation of lower intensity, and conversely to reduce the number of stages of any or all stages that generate radiation of higher intensity. Increasing the number of stages that emit at a particular center wavelength amounts to replicating the low intensity stage itself.

In this design, the per-stage intensity of a first group stages with higher aggregate intensity is greater than the per-stage intensity of a second group of stages with lower aggregate intensity. This aspect of our design reduces the difference between the aggregate intensities of the two groups, if the second group has more stages than the first group.

Figure 2:
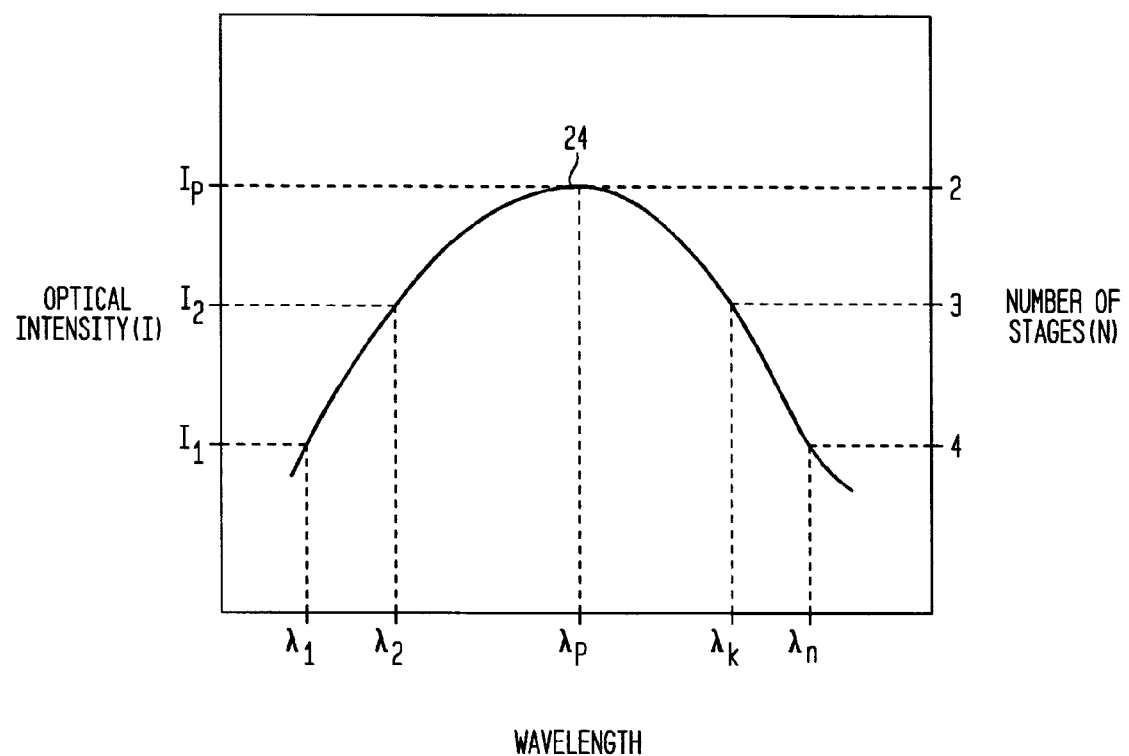
FIG. 2 is a graph illustrating the variation of optical intensity with wavelength across a cascade of RT regions, as well as the variation of the number of stages with wavelength within the cascade, in an ISB laser in accordance with one embodiment of our invention.
Figure 7:
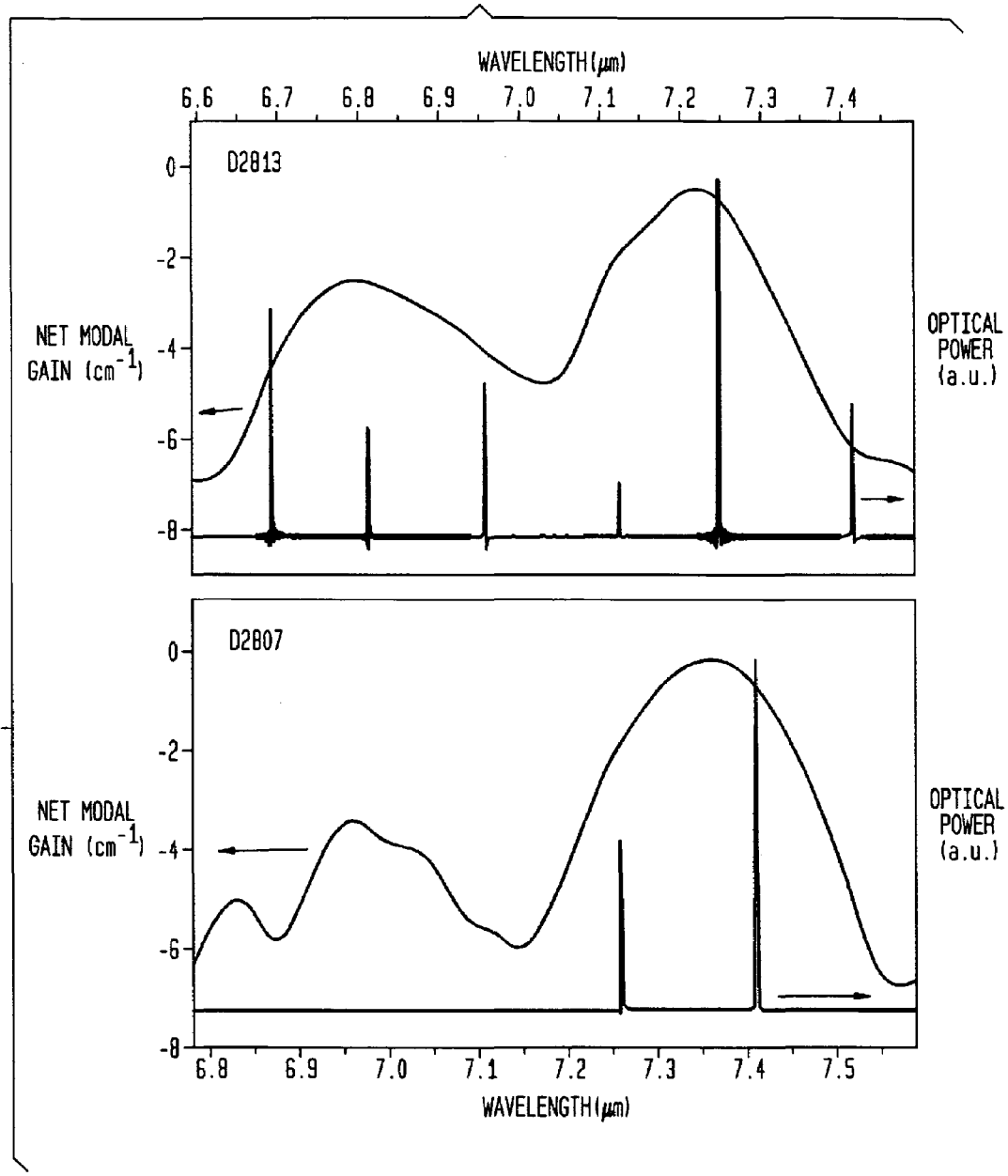
FIG. 7 shows optical spectra of two lasers at I=1.35 A (D2807) and I=1.2 A (D2813) and corresponding gain curves. The latter were calculated from the luminescence spectra near threshold at I=0.6 and I=0.8 A, respectively.

This principle can be better understood with reference to FIG. 2 where the curve 24 illustrates the variation of optical intensity (I) with n center wavelengths ($\lambda_n$). (Although the curve 24 is depicted as being Gaussian, its actual shape depends on the design of the laser; e.g., FIGS. 5 & 7.) These wavelengths correspond to n stages (or n groups of stages) in the cascade of an ISB laser. Although the wavelengths are arranged in what appears to be monotonically increasing order from $\lambda_1$ to $\lambda_n$, the physical location of the corresponding stages within the cascade need not follow this pattern. Thus, the stages could be ordered in any arbitrary fashion: e.g., in monotonically decreasing order, in a sawtooth order, or in a totally random order. In any event, the application of the principles of our invention are the same. Thus, returning to FIG. 2, stages that emit at $\lambda_1$ and $\lambda_n$ are depicted as emitting radiation at low intensity $I_1$, and therefore have a larger number of stages (4 by way of illustration). Stages that emit at $\lambda_2$ and $\lambda_k$ are depicted as emitting radiation at a higher intensity $I_2$, and therefore have a smaller number of stages (3 by way of illustration). On the other hand, stages that emit at the peak wavelength $\lambda_p$ are depicted as emitting radiation at the peak intensity $I_p$, and therefore have the smallest number of stages (2 by way of illustration).

Similar comments apply to other broadband CLEs in which the principles of our invention are used to flatten the intensity profile across the output spectrum of the emitter.

EXAMPLE

This example describes a Group III-V compound semiconductor, broadband ISB laser that was designed for operation at center wavelengths of 6.9 μm to 7.9 μm. Various materials, dimensions and operating conditions are provided by way of illustration only and, unless otherwise expressly stated, are not intended to limit the scope of the invention.

More specifically, the ISB laser of this example enabled us to achieve a small (about 4 cm$^{-1}$) gain ripple across our target wavelength region and demonstrate the broadband cw operation of QC lasers. These lasers emitted simultaneously at many modes between 6.7 μm and 7.4 μm at temperatures ranging from 20 to 77 K.

The lasers were grown by Molecular Beam Epitaxy (MBE) using $In_{0.53}Ga_{0.47}As$ and $Al_{0.48}In_{0.52}As$ lattice matched to an InP substrate. The bottom cladding region 12 was formed by the low n-type doped (n~2×10$^{17}$ cm$^{-3}$) InP substrate. A 600 nm thick n-doped (3×10$^{16}$ cm$^{-3}$) InGaAs layer followed by 35 stages (I/R and RT regions) designed for emission at 11 different wavelengths (See, Gmachl et al., *Nature*, supra.), and another 400 nm thick (3×10$^{16}$ cm$^{-3}$) InGaAs layer formed the core region 14. The top cladding region 16 comprised two 1.5 μm and 800 nm thick, low doped (5×10$^{16}$ cm$^{-3}$ and 1×10$^{17}$ cm$^{-3}$, respectively) AlInAs layers followed by a 500 nm thick highly doped (5×10$^{18}$ cm$^{-3}$) InGaAs layer. This design provided plasmon-enhanced optical confinement, as described by C. Sirtori et al., *Appl. Phys. Lett.*, Vol. 66, No. 24, pp. 3242–3244 (1995), which is incorporated herein by reference.

Figure 3A:
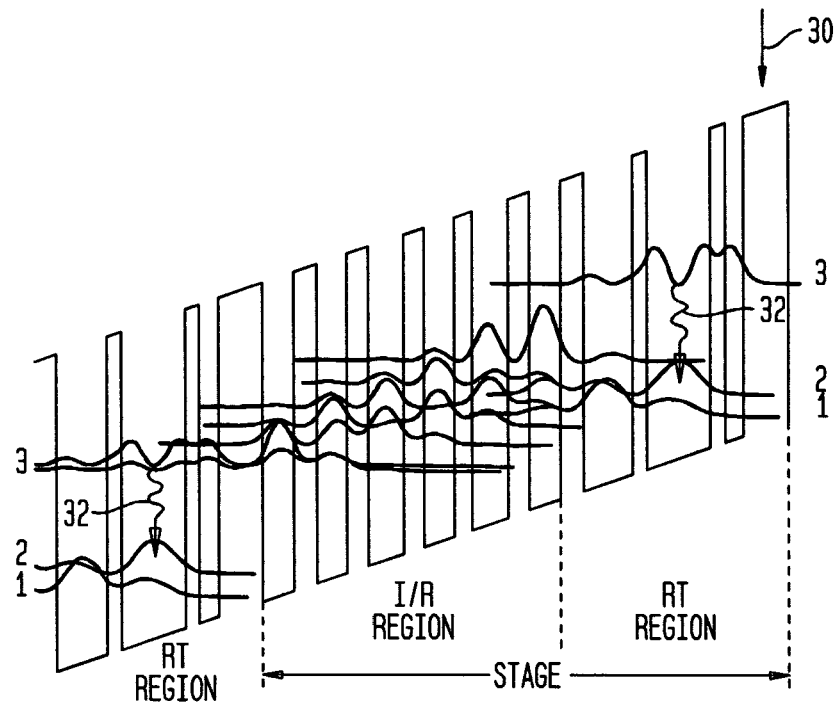
FIG. 3a is a conduction band diagram (calculated at 59 kV/cm) depicting two RT regions designed for the emission at 7.25 $\mu$m (right) and 7.40 $\mu$m (left) and the intermediate I/R region. The layer thicknesses in nanometers from right to left starting from the I/R barrier (indicated by arrow 30) are as follows: 4.2/1.9/1.3/6.3/1.4/4.9/2.0/3.3/1.9/3.2/1.9/3.1/2.0/3.0/2.1/3.0/2.2/3.0/4.2/2.0/1.3/6.3/1.3/5.0/2.0. AlInAs layers are in bold face type. The remaining layers are GaInAs. The moduli squared of the wavefunctions involved in the laser emission (wavy arrows 32) are shown.

All RT regions were designed to be of the well-known three-well vertical transition type as shown in FIG. 3a and as described by Faist et al, *Appl. Phys. Lett.*, Vol. 68, No. 26, pp. 3680–3682 (1996), which is incorporated herein by reference. Optical radiation (wavy arrows 32) was generated by electrons undergoing intersubband transitions between energy levels 3 and 2. The wavelength was varied by changing the thickness of the quantum wells (QWs) of the RT regions and was designed, in this case, to decrease monotonically from the bottom to the top of the device, spanning the range from 6.9 μm to 7.9 μm (FIG. 3b).

Figure 3B:
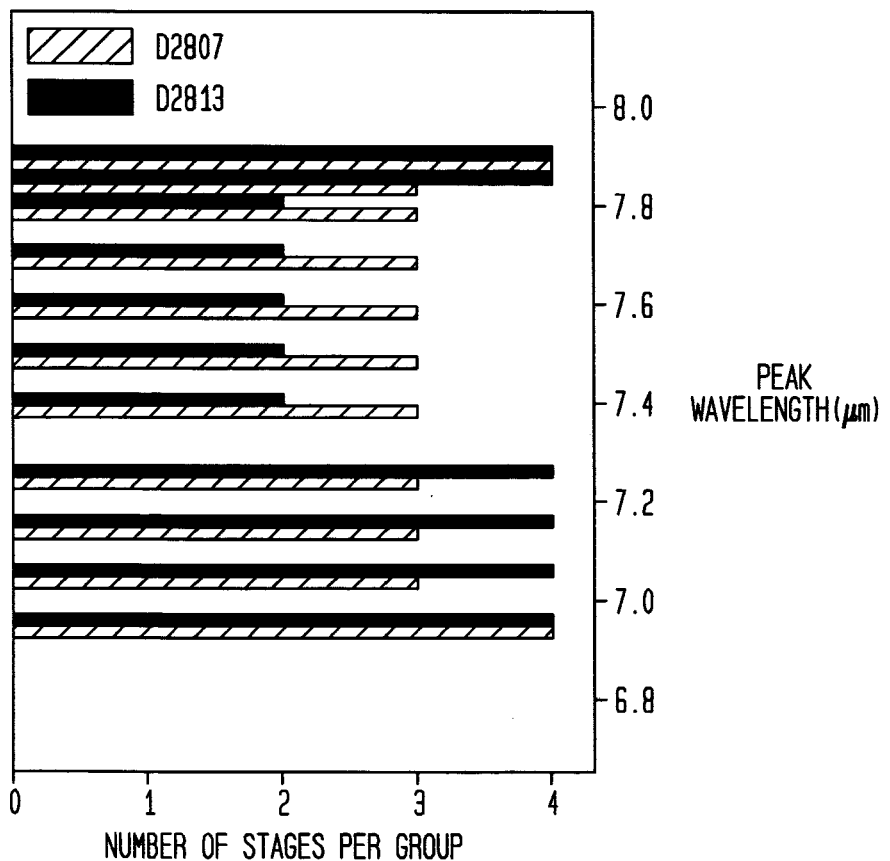
FIG. 3b is a bar graph showing the number of stages centered at each design wavelength. The design central wavelengths of the corresponding RT regions are the same for two wafers (designated D2807 and D2813) but are offset for clarity.

In our first wafer (D2807) we chose the number of RT regions centered at each wavelength to be 3 except at the ends of the cascade where 4 stages were formed at wavelengths of about 6.9 μm and 7.9 μm, as shown in FIG. 3b. As we will discuss later in more detail, lasers fabricated from D2807 wafers still exhibited significant variations of modal gain across the desired spectral range. One way to compensate for the observed gain variations would be to redesign the cascade by adjusting the thicknesses of all quantum wells according to the results of the measurements. However, such an approach is time-consuming and inefficient due to the difficulties in relating the detailed shape of the observed gain spectrum to the thickness of the wells and barriers. We have demonstrated another, much simpler method, in accordance with our invention, which allows us to achieve a sufficiently flat gain without additional elaborate efforts to redesign the cascades.

In our approach we have changed the number of RT regions at each wavelength according to the measured optical gain envelope (which is directly related to the optical intensity profile of FIG. 2). Explicitly, we have increased the number of stages (and hence RT regions) at the wavelengths with low gain (low intensity) and have decreased the number of stages at the spectral regions with high gain (high intensity). In the resulting design (wafer D2813) the number of stages is modified as shown in FIG. 3b; that is, the lowest gain (intensity) wavelengths between about 6.9 $\mu$m and 7.3 $\mu$m and around 7.9 $\mu$m each have the highest number of stages (4 in this example); and the highest gain (intensity) wavelengths (five wavelengths between about 7.4 $\mu$m and 7.8 $\mu$m) each have the lowest number of stages (2 in this example). Note, in both D2807 and D2813 wavelengths at the ends of the cascade have the highest number of stages, which comes about because the RT regions at the ends of the cascade experience less optical overlap with adjacent RT regions than do RT regions that are centrally located within the cascade.

As discussed earlier, the particular ordering of the wavelengths according to a monotonic sequence is not essential. The wavelengths could be ordered in any arbitrary fashion, including a purely random sequence. Two factors determine the number of stages per group: (1) the gain or intensity per stage and hence the aggregate intensity of the group, and (2) the location of the group within the cascade; i.e., a group that either has low aggregate intensity or is located at or near the ends of a cascade is typically designed to have a larger number of stages than a group that is centrally located within the cascade; and a group that both has low aggregate intensity and is located at or near the ends of a cascade is typically designed to have an even larger number of stages.

Our approach may not perfectly compensate for all variations of the optical gain. Small variations may possibly be present due to the limited number of the designed wavelengths and digitization of the number of stages centered at each wavelength. However, those skilled in the art will readily appreciate that the remaining gain variations can be compensated by other techniques such as changing the doping at different wavelength stages, varying the waveguide losses, etc.

The lasers were processed as deep-etched ridges about 10 to 14 $\mu$m wide and were cleaved to lengths of 3 to 4 mm. The lasers were mounted inside a helium flow cryostat and all measurements were performed at cryogenic temperature (T~20 K) and under an applied DC bias. The optical spectra were measured with a Nicolet fast Fourier transform infrared spectrometer and a cooled MCT detector or a DTGS detector when the laser output power was high.

Figure 4:
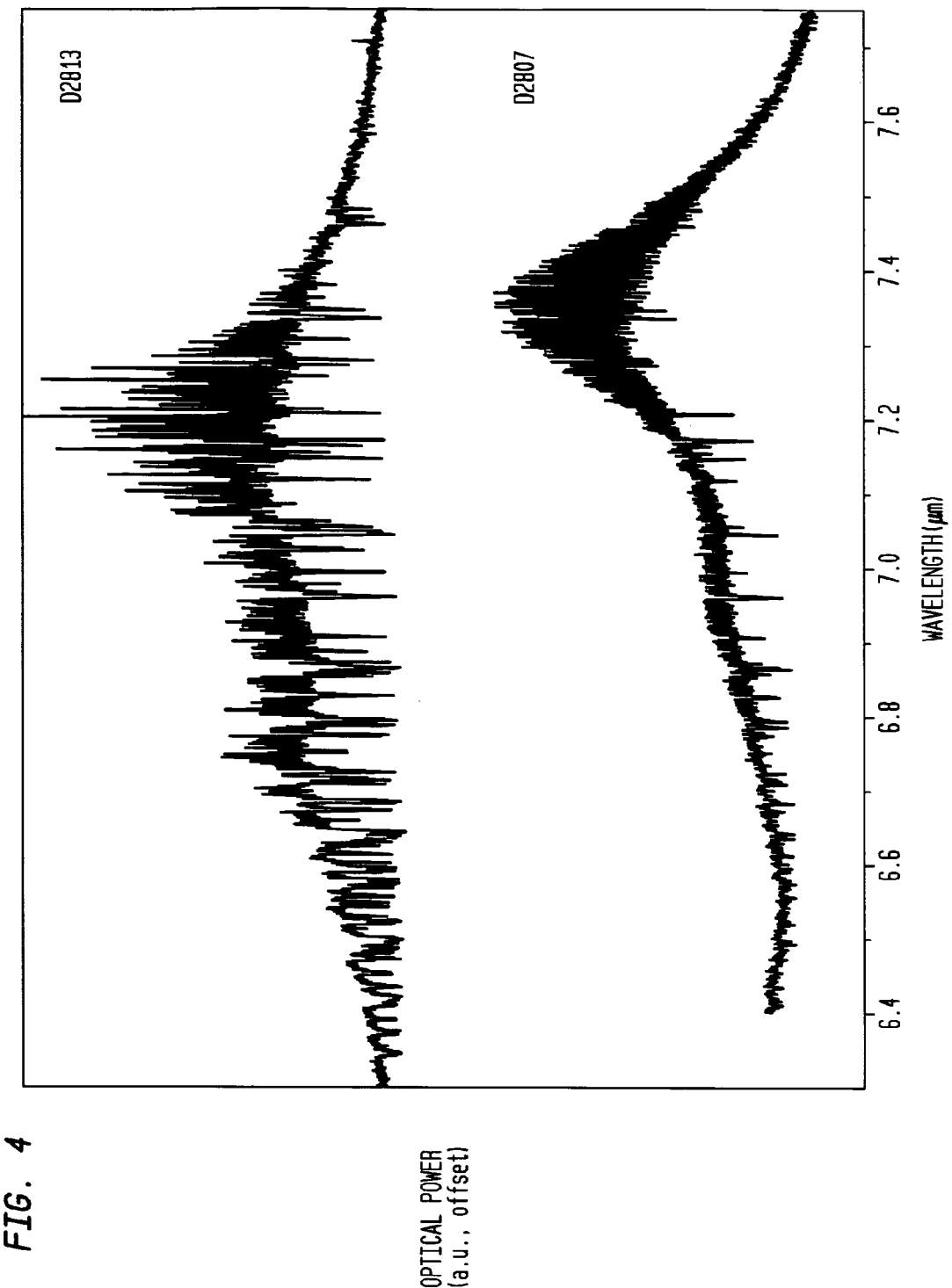
FIG. 4 shows the subthreshold electroluminescence spectra of two QC lasers made from wafers D2807 and D2813 operating in cw at T=20 K. The DC current is I=0.5 A for the laser from D2807 (threshold 0.63 A) and I=0.73 A for the laser from D2813 (threshold 0.82 A). The sharp peaks are caused by water absorption in the air between the laser and the detector.
Figure 5:
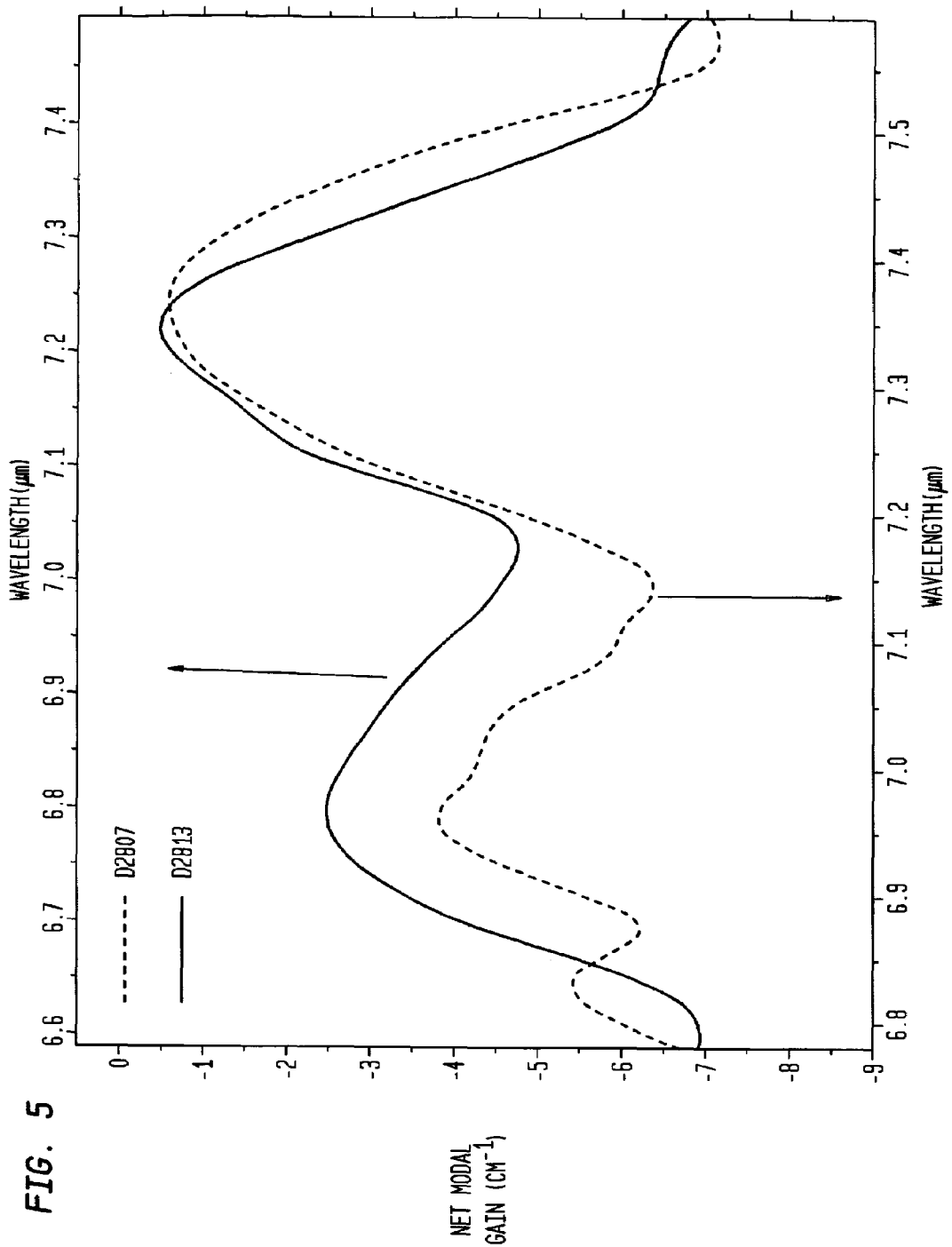
FIG. 5 shows net modal gain calculated from the luminescence spectra at a DC current close to threshold, at I=0.6 A (D2807) and I=0.8 A (D2813), respectively.

FIG. 4 shows subthreshold electroluminescence spectra of cw lasers made from wafers D2807 and D2813. The Fabry—Perot fringes were resolved in the measurements, but are not seen in FIG. 4. The net modal gain was calculated from the fringe amplitude using the method developed by Hakki and Paoli, *J. Appl. Phys*, Vol. 46, No. 3, pp. 1299–1306 (1975), which is incorporated herein by reference. FIG. 5 shows the net modal gain of both lasers calculated from the luminescence spectra at a DC bias current close to threshold. The lasers made from wafer D2813 had a smoother and more uniformly distributed gain across the targeted spectral region. Although perhaps not apparent to the naked eye, the peak-to-valley swings of the modal gain are in fact less severe in lasers made from wafer D2813 than D2807. This observation is confirmed from our measurements of the gain ripple, which was about 4 cm$^{-1}$ for lasers made from D2813 but more than 6.5 cm$^{-1}$ for lasers made from D2807. The small wavelength shift between the lasers resulted from unavoidable variations between MBE growth cycles.

The gain ripple could be reduced even further by another design iteration in which, for example, more stages are added to groups corresponding to particularly low gain wavelengths (e.g., 6.6 $\mu$m, 7.03 $\mu$m and 7.45 $\mu$m).

Figure 6:
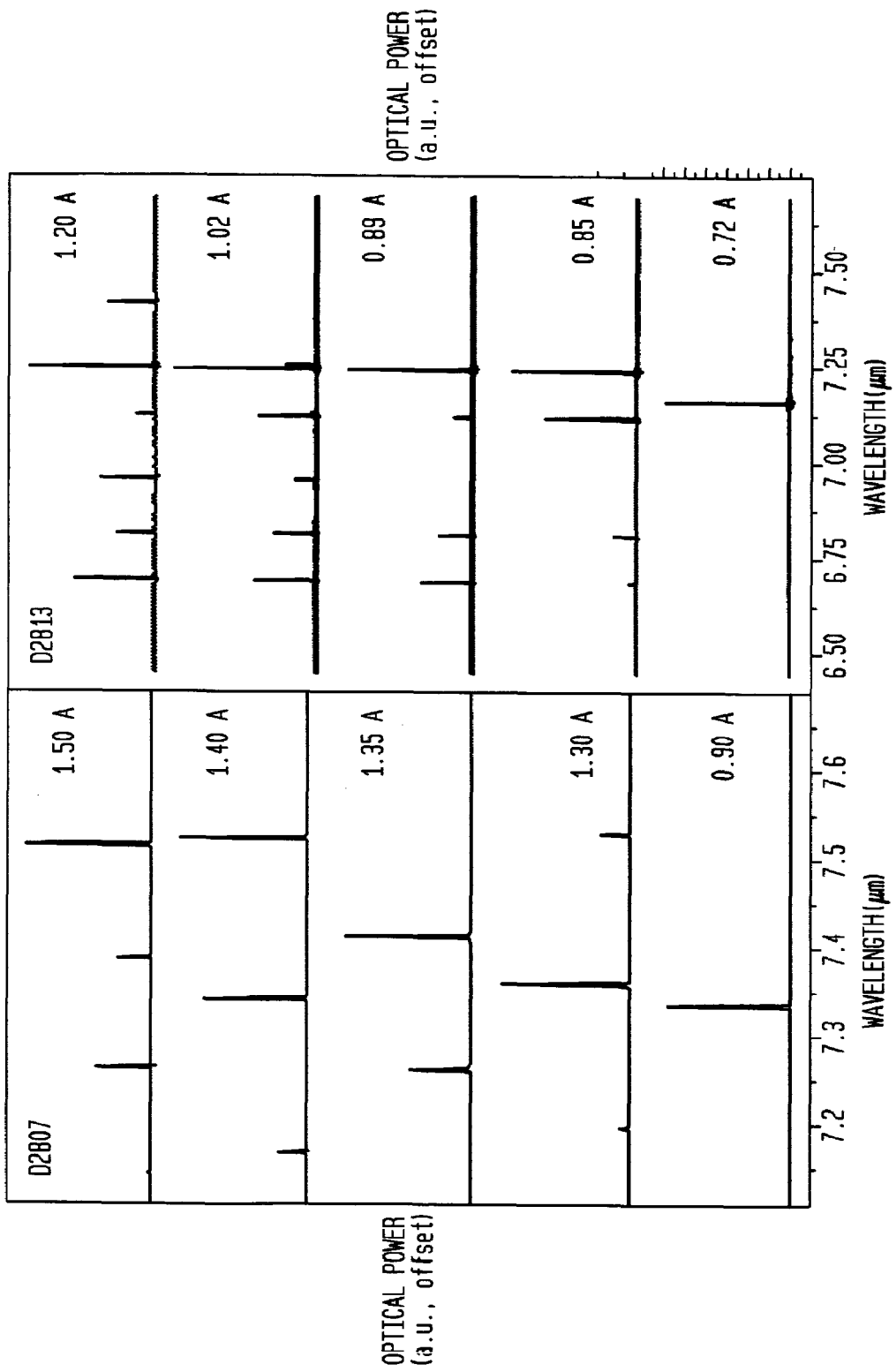
FIG. 6 shows laser spectra of D2807 (left) and D2813 (right) operating cw at T=20 K at different bias currents.

The advantages of the more uniform gain of lasers made from D2813 are explicitly seen in laser operation above threshold. FIG. 6 shows the optical spectra of both types of laser operating in cw at different values of operating current. Just above threshold, both lasers are single mode at wavelengths corresponding to the peak gain. In lasers made from D2813 a smaller increase of the current by approximately 20% to I=0.85 A resulted in the appearance of several additional modes. (The increase in the operating current required to excite additional modes slightly varies from device to device.) As the current was further increased, additional modes appeared across the entire gain spectra. At I=1.2 A the laser made from D2813 emitted 6 modes between 6.7 $\mu$m and 7.4 $\mu$m.

In contrast, lasers made from D2807 started to emit multiple modes only when the current was increased by almost 50% to 1.3 A. But even at higher current the lasing modes existed only in part of the gain spectrum. This fact can be clearly seen at I=1.35 A (lasers from D2807) and I=1.2 A (lasers from D2813) in FIG. 7, where the gain profile is shown in overlap with the laser spectra. In lasers made from D2807 lasing modes existed only at long wavelengths, while in lasers made from D2813 lasing modes existed across the entire gain spectrum.

Figure 8:
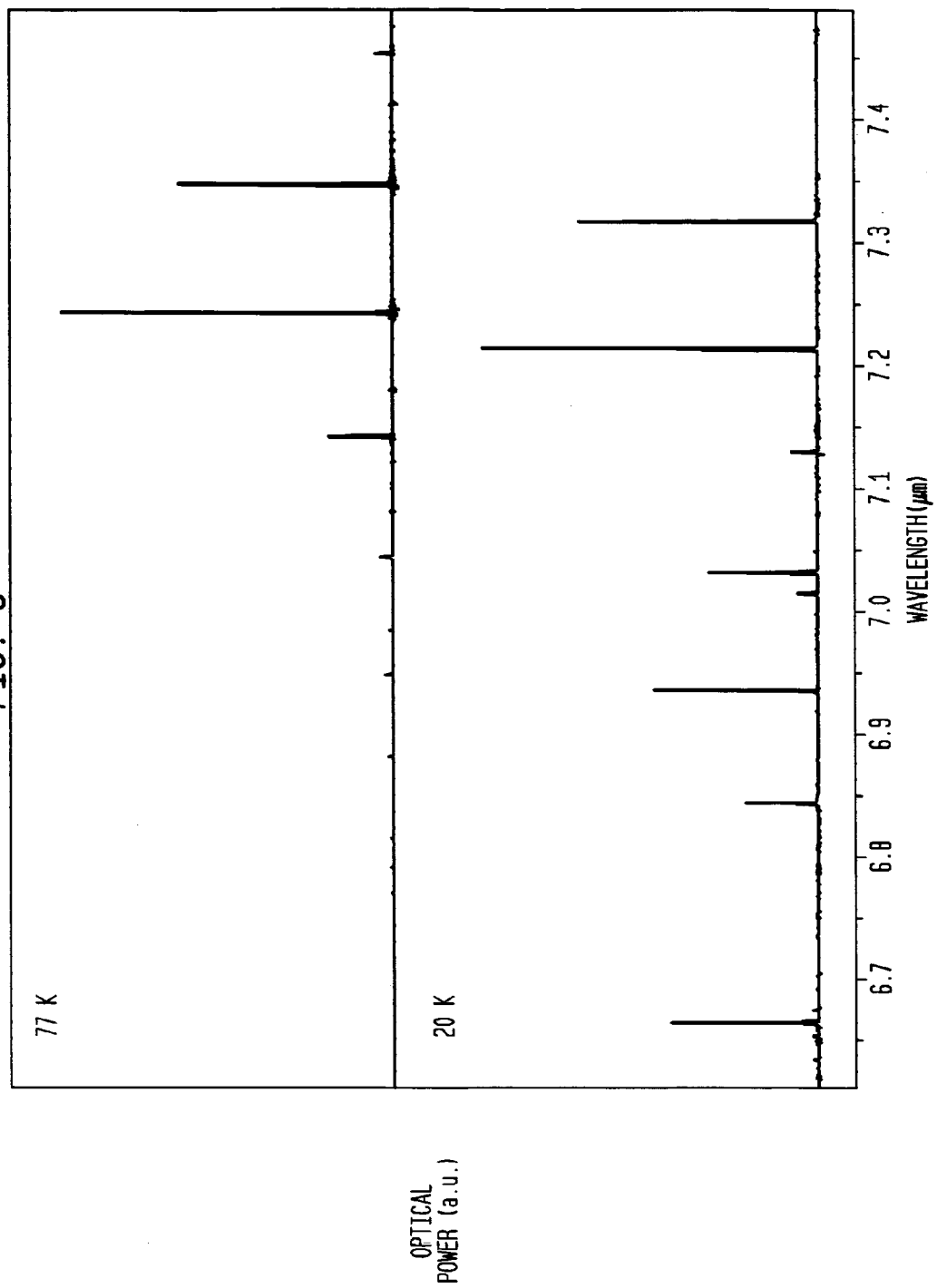
FIG. 8 shows optical spectra of a QC laser (D2813) at I=1.0 A operating cw at T=20 K (bottom) and T=77 K (top).

The output of lasers made from D2813 was broadband up to a maximal temperature about T=77 K as shown in FIG. 8. In these lasers the spectral range of optical emission at T=77 K, 7.05 $\mu$m–7.35 $\mu$m, was narrower (by more than a factor of two) than that at T=20 K and was comparable to the spectral range of the lasers made from D2807 at T=20 K. The optical spectra of lasers made from D2813 exhibited a well-known red shift with increasing of the temperature. (See, Faist et al., *Appl. Phys. Lett.*, supra.)

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention. In particular, our broadband cw QC laser can serve as a single mode source of mid-IR radiation tunable over a wide spectral range when used in conjunction with an external grating, as discussed by Luo et al., *IEEE J. Quantum Electron.*, Vol. 38, No. 5, pp. 486–494 (May 2002), which is incorporated herein by reference. Such a tunable source is of a particular interest for chemical sensing, as discussed by Kosterev et al., *IEEE J. Quantum Electron.*, Vol. 38, No. 6, pp. 582–591 (June 2002), which is also incorporated herein by reference.

We claim:

1. A broadband CLE capable of operation simultaneously at multiple wavelengths comprising:
   a core region including a multiplicity of stages, each stage including a radiative transition region, characterized by
   a first group of stages for emitting radiation at a first wavelength and at a first aggregate intensity,
   a second group of stages for emitting radiation at a second wavelength and at a second aggregate intensity lower than said first intensity, characterized in that
   said second group has more stages than said first group, the per-stage intensity of said first group being greater than the per-stage intensity of said second group, thereby to reduce the difference between said first and second aggregate intensities.

2. The CLE of claim 1, wherein said multiplicity of stages defines a cascade and wherein said second group is located at or near the ends of said cascade.

3. The CLE of claim 2, wherein said first group is located centrally within said cascade.

4. The CLE of claim 1, wherein said RT region is a unipolar region.

5. The CLE of claim 4, wherein said CLE is an ISB laser capable of cw operation simultaneously at each of said multiple wavelengths.

6. A quantum cascade laser comprising:
   a core region including a multiplicity of stages for emitting broadband stimulated emission of optical radiation simultaneously at multiple wavelengths when pumping energy is applied thereto, each stage including a unipolar radiative transition (RT) region and a relaxation/injection (I/R) region adjacent thereto,
   a pair of cladding regions bounding said core region, and electrodes for applying an electric field to said laser effective to generate said optical radiation,
   means forming an optical resonator that includes said core region, characterized by
   a first group of stages for emitting radiation at a first wavelength and at a first aggregate intensity,
   a second group of stages for emitting radiation at a second wavelength and at a second aggregate intensity lower than said first intensity,
   said second group having more stages than said first group the per-stage intensity of said first group being greater than the per-stage intensity of said second group, thereby to enable said laser to operate continuous wave simultaneously at each of said wavelengths.

7. The laser of claim 6, wherein said multiplicity of stages defines a cascade of said stages and wherein said second group is located at or near the ends of said cascade.

8. The laser of claim 7, wherein said first group is located centrally within said cascade.

9. A method of fabricating a broadband CLE capable of operation simultaneously at multiple wavelengths comprising the steps of:
   (a) designing the CLE to include a core region that has a cascade of stages, each stage including a radiative transition region, and designing said cascade to include a multiplicity of groups of stages for emitting radiation each at a different wavelength, most of said groups being initially designed to have essentially the same number of stages,
   (b) measuring the optical intensities generated by said groups and identifying those groups that have lower aggregate intensities,
   (c) redesigning the CLE so as to increase the number of stages in at least one group that was identified as having a lower intensity than at least one other group; and
   (d) constructing said CLE according to the redesign of step (c).

10. The method of claim 9, wherein in step (a) two of said groups are designed to be located at opposite ends of the cascade and initially to have more stages than groups located centrally within said cascade, the centrally located groups initially being designed to have the same number of stages.

* * * * *